(12) United States Patent
Miller et al.

(10) Patent No.: US 7,437,624 B2
(45) Date of Patent: *Oct. 14, 2008

(54) METHOD AND APPARATUS FOR ANALYZING SERIAL DATA STREAMS

(75) Inventors: Martin Miller, Avusy (CH); Yaron Habot, Teaneck, NJ (US); Joseph Schachner, Suffern, NY (US); Michael Schnecker, Doylestown, PA (US); Peter J. Pupalaikis, Ramsey, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 694 days.

This patent is subject to a terminal disclaimer.

(21) Appl. No.: 10/673,735

(22) Filed: Sep. 29, 2003

(65) Prior Publication Data

US 2004/0123208 A1   Jun. 24, 2004

Related U.S. Application Data

(60) Provisional application No. 60/415,236, filed on Sep. 30, 2002.

(51) Int. Cl.
G06K 5/04 (2006.01)
G01R 13/00 (2006.01)

(52) U.S. Cl. ......................... 714/700; 702/66
(58) Field of Classification Search ................. 714/700, 714/52, 51, 55, 814, 746, 815, 798, 799, 714/744, 707; 324/121 R, 719, 756; 702/66
See application file for complete search history.

(56) References Cited

U.S. PATENT DOCUMENTS

| | | | |
|---|---|---|---|
| 3,449,671 A | 6/1969 | Long | |
| 3,562,710 A | 2/1971 | Halleck | |
| 3,778,550 A | 12/1973 | David et al. | |
| 4,100,531 A | 7/1978 | Fletcher | |
| 4,375,694 A | 3/1983 | Kuhn | |
| 4,566,100 A * | 1/1986 | Mizuno et al. | 714/704 |
| 4,615,040 A * | 9/1986 | Mojoli et al. | 375/267 |
| 4,633,465 A | 12/1986 | Fitch et al. | |
| 4,680,778 A | 7/1987 | Krinock | |

(Continued)

FOREIGN PATENT DOCUMENTS

DE   2462046 A1   11/1975

(Continued)

OTHER PUBLICATIONS

Roland E. Best, *The Software PLL, Phase Locked Loops*, 3rd Edition, McGraw-Hill, New York, 1997, pp. 229-249.

(Continued)

*Primary Examiner*—Phung M Chung
(74) *Attorney, Agent, or Firm*—Frommer Lawrence & Haug LLP; William S. Frommer

(57) ABSTRACT

An apparatus for processing a data signal is provided. The apparatus comprises an acquisition unit of a test instrument for acquiring a data signal for a predetermined time, a memory of the test instrument for storing the data signal, and a clock recovery unit for recovering a clock signal from the stored data signal. A processor slices the stored data signal into a plurality of data segments of a predetermined length in accordance with the recovered clock signal.

24 Claims, 7 Drawing Sheets

U.S. PATENT DOCUMENTS

| | | | |
|---|---|---|---|
| 4,694,244 | A | 9/1987 | Whiteside et al. |
| 4,758,963 | A | 7/1988 | Gordon et al. |
| 4,843,309 | A | 6/1989 | Kareem et al. |
| 4,876,655 | A | 10/1989 | Carlton et al. |
| 4,964,117 | A | 10/1990 | Shier |
| 5,159,609 | A | 10/1992 | Palicot |
| 5,180,971 | A | 1/1993 | Montijo |
| 5,214,784 | A | 5/1993 | Ward et al. |
| 5,222,101 | A | 6/1993 | Ariyavisitakul |
| 5,305,635 | A | 4/1994 | James et al. |
| 5,337,403 | A | 8/1994 | Klingman |
| 5,402,443 | A | 3/1995 | Wong |
| 5,432,791 | A | 7/1995 | Gancarcik |
| 5,631,759 | A | 5/1997 | Bogdan et al. |
| 5,654,987 | A | 8/1997 | Nakamura |
| 5,714,878 | A | 2/1998 | Saito et al. |
| 5,726,607 | A | 3/1998 | Brede et al. |
| 5,761,216 | A | 6/1998 | Sotome |
| 5,761,434 | A | 6/1998 | Hewitt |
| 5,761,537 | A | 6/1998 | Sturges et al. |
| 5,789,954 | A | 8/1998 | Toeppen et al. |
| 5,825,825 | A | 10/1998 | Altmann et al. |
| 5,900,755 | A | 5/1999 | Toeppen et al. |
| 5,907,587 | A | 5/1999 | Sokoler |
| 5,914,592 | A | 6/1999 | Saito |
| 5,943,378 | A | 8/1999 | Keba et al. |
| 5,953,071 | A | 9/1999 | Van Zon |
| 5,966,684 | A | 10/1999 | Richardson et al. |
| 5,978,742 | A | 11/1999 | Pickerd |
| 5,999,163 | A | 12/1999 | Ivers et al. |
| 6,009,132 | A | 12/1999 | Scholtz |
| 6,044,123 | A | 3/2000 | Takla |
| 6,112,160 | A | 8/2000 | Salant et al. |
| 6,188,737 | B1 | 2/2001 | Bruce et al. |
| 6,212,246 | B1 | 4/2001 | Hendrickson |
| 6,215,363 | B1 | 4/2001 | Conta et al. |
| 6,278,357 | B1 | 8/2001 | Croushore et al. |
| 6,295,327 | B1 | 9/2001 | Takla |
| 6,311,138 | B2 | 10/2001 | Miller |
| 6,356,127 | B1 | 3/2002 | Klipper et al. |
| 6,366,631 | B1 | 4/2002 | Nakayama et al. |
| 6,407,970 | B2 * | 6/2002 | Verboom ............ 369/59.17 |
| 6,445,230 | B1 | 9/2002 | Rupp et al. |
| 6,463,109 | B1 * | 10/2002 | McCormack et al. ....... 375/355 |
| 6,522,122 | B2 | 2/2003 | Watanabe et al. |
| 6,539,318 | B2 | 3/2003 | Miller et al. |
| 6,546,345 | B1 | 4/2003 | Ghiasi |
| 6,549,859 | B1 | 4/2003 | Ward |
| 6,571,186 | B1 | 5/2003 | Ward |
| 6,615,148 | B2 | 9/2003 | Pickerd |
| 6,642,926 | B1 | 11/2003 | Letts |
| 6,643,346 | B1 | 11/2003 | Pedrotti et al. |
| 6,647,523 | B2 | 11/2003 | Manning |
| 6,675,328 | B1 | 1/2004 | Krishnamachari |
| 6,738,922 | B1 | 5/2004 | Warwar et al. |
| 6,812,688 | B2 * | 11/2004 | Tan et al. ............ 324/121 R |
| 6,836,738 | B2 | 12/2004 | Sepp et al. |
| 6,850,852 | B1 | 2/2005 | Ferguson et al. |
| 6,853,696 | B1 * | 2/2005 | Moser et al. ............ 375/375 |
| 6,922,384 | B2 * | 7/2005 | Miyashita et al. ........ 369/59.22 |
| 6,996,202 | B2 * | 2/2006 | McCormack et al. ....... 375/355 |
| 2001/0021151 | A1 * | 9/2001 | Verboom ............ 369/53.35 |
| 2002/0018572 | A1 | 2/2002 | Rhoads |
| 2002/0034337 | A1 | 3/2002 | Shekter |
| 2002/0128787 | A1 | 9/2002 | Seng et al. |
| 2003/0004664 | A1 | 1/2003 | Ward et al. |
| 2003/0163266 | A1 | 8/2003 | Ward et al. |
| 2004/0123018 | A1 * | 6/2004 | Miller et al. ............ 711/100 |
| 2004/0123191 | A1 * | 6/2004 | Salant et al. ............ 714/704 |
| 2004/0123208 | A1 | 6/2004 | Miller et al. |
| 2004/0153883 | A1 | 8/2004 | Miller et al. |

FOREIGN PATENT DOCUMENTS

| | | |
|---|---|---|
| EP | 0 241 142 | 10/1987 |
| EP | 0 444 875 | 9/1991 |
| EP | 0 631 143 | 12/1994 |
| EP | 1 074 845 | 2/2001 |
| EP | 1 118 866 | 7/2001 |
| EP | 1 244 241 | 9/2002 |
| GB | 2 138 575 A | 10/1984 |
| JP | 62003544 | 1/1987 |
| JP | 4105070 | 4/1992 |
| JP | 5196641 | 8/1993 |
| JP | 5264595 | 10/1993 |
| JP | 9005362 | 1/1997 |
| JP | 10163859 | 6/1998 |
| JP | 11098876 | 4/1999 |
| JP | 8220144 | 6/1999 |
| WO | WO 00/60806 | 10/2000 |
| WO | WO 2004 032049 A2 | 4/2004 |

OTHER PUBLICATIONS

*Using FPGAs for Digital Applications*, Actel Corporation, Apr. 1996.

HP E4543A Q Factor and Eye Contours Application Software, Hewlett Packard, 1999.

Infiniium DCA, Agilent Technologies, Mar. 7, 2002.

Communication waveform measurements, Hewlett Packard, Jun. 26, 1996.

Advanced Analysis of High-Speed Digital Communication Waveforms, Hewlett Packard Jun. 27, 1994.

R.E. Anderson and E. M. Foster, Design of an MPEG-2 Transport Demultiplexor Core, IBM, 1999.

Technology Standards, Tektronix Website (www.tek.com/Measurement/Solutions/tech_standards/index.html?wt=257).

Communications Signal Analyzer, Tektronix Website (www.tektronix.com/optical).

RT-Eye™ Serial Data Compliance and Analysis Software, Tektronix Website (www.Tektronix.com/accessories).

Design of FIR Filters by Windowing, MIT Website, (http://web.mit.edu/6.555/www/fir.html).

A New Digital PLL at the Technische Unversitaet Berlin, Technische Unversitaet Berlin Website (www.tdl.com/ gottsch/tuberlin.htm).

Low Jitter Digital PLL—ZL30497, Zalink Semiconductor Website, (http://products.zarlink.com/product_portlets/new_timer.htm).

Michael K. Williams, et al., A Discussion of Methods for Measuring Low-Amplitude Jitter, International Test Conference, Paper 28.1, pp. 646-652.

Russ Brown, Quantam Corporation, "Eye Diagram Data", SCSI Physical Working Group, Feb. 9, 2000.

Dave Fink, Tektronix "Introduction to Measurement Techniques and Analysis of Emerging Serial Data Standards", Nov. 2002.

"Methodologies for Jitter Specification Technical Report" Rev 10, Jun. 9, 1999.

Andy Baldman, University of New Hampshire "Description of XAUI Physical Layer Measurements Performed At The UNH Interoperability Lab", Oct. 30, 2002.

University of New Hampshire Technical Document, "fast Ethernet" Feb. 13, 2003.

Dennis Dickerson, Fiber Optic Test and Measurement (Chapter 8); Prentice Hall PTR, 1998, pp. 284-338.

Adam Healey et al., "Fast Ethernet Consortium—100 Base-TX PMD Test Suite", Version 2.4 and Version 2.5; InterOperability Lab, 1998-1999.

Adam Healey, "Fast Ethernet Consortium Notebook", 1996-1997 14 pps.

* cited by examiner

METHOD AND APPARATUS FOR ANALYZING SERIAL DATA STREAMS

CROSS REFERENCE TO RELATED APPLICATIONS

This application claims the benefit of U.S. Provisional Patent Application Ser. No. 60/415,236, filed Sep. 30, 2002, the entire contents of which is incorporated herein by reference.

FIELD OF THE INVENTION

The present invention relates to a method of acquiring and processing a received data signal for analysis in a digital oscilloscope.

BACKGROUND OF THE INVENTION

Traditionally, when receiving waveforms for processing by a test instrument, such as an oscilloscope, the waveforms are acquired as a number of discrete acquisitions, the timing of the start and/or end of each acquisition being defined in accordance with a trigger signal. The trigger signal is typically a synchronous with the sampling process and generated in accordance with an external signal, clock or frame synchronization signal. The difference in time of the moment of the trigger and the sampling process is measured, and thus, each acquired waveform's samples are assigned to a particular phase, relative to the trigger signal. These typically brief waveforms, or data acquisition segments, are either stored for later processing, or may be processed immediately. However, this acquisition scheme has a number of significant drawbacks when used in a high-speed data acquisition environment. The quality and consistency of the data acquisitions are dependent on the precision of the timing measurement relating the trigger signal to the timing of the sampling clock used to store the data signal. Any imprecision in the timing measurement between the two, known as trigger jitter, will result in the phase of the discrete data signal acquisitions to be out of synchronization with the true phase of the data signal, as well as with the phase of the other data acquisitions, thus limiting the ability to compare various ones of the data signal acquisitions, and moreover limiting the ability to correctly characterize the signal.

Additionally, the generation of a precisely accurate clock signal is made harder when a high-speed data acquisition with a substantially large number of bits is to be acquired. The high-speed nature of the acquisition requires a very fast clock signal, thus compounding the possibility for jitter. Because of the extremely short acquisition times, any clock jitter becomes a larger percentage of the acquisition time, thus resulting in an even larger phase difference between the various acquisition data segments. While it would be possible to use a slower clock signal and leave out some data from the data signal so that all of the data is not stored and processed, this method is undesirable because, for example, a non-recurring error may be encountered but not properly identified and processed because all of the data will not be considered.

An additional limitation with this method is that a dead-time is incurred between each signal acquisition, while the time measurement apparatus and storage apparatus are prepared to record another acquisition. In the context of measurements performed on a serial data signal, the dead-time inherent in this method prohibits the analysis of immediately adjacent data bits as distinct waveforms, or for that matter a long stream of contiguous data bits as distinct waveforms.

Therefore, an improved method and apparatus for acquiring and processing an acquired data signal for analysis in a test instrument, such as a digital oscilloscope, is desired.

SUMMARY OF THE INVENTION

In accordance with the invention, a method and apparatus are provided for acquiring a long, continuous portion of a data stream that allows for the capture of every bit in a received signal under test during a predetermined time period, corresponding to up to millions of bits or more. In opposition to current techniques that typically do not save a long record and therefore cannot show individual bits as desired, in accordance with the present invention, a long, continuous data signal is acquired so that each and every bit in the signal can be processed and later retrieved.

In order to later process the acquired and stored data signal, since the stored data signal is a single long acquisition with no predetermined dividing points, it is advantageous to generate a clock signal synchronous to some regularly occurring event in the acquired data signal. Therefore, in accordance with the invention, the acquired waveform that is to be divided up to generate a series of "sample sets" or "slices" at nearly uniform sample intervals is analyzed for threshold crossings. The expected times of these threshold crossings obtained after various processing correspond to the regular intervals of an entirely conceptual or virtual "periodic clock". Such a step in what is called "clock recovery" determines generally the frequency of the virtual clock. However, the complete process of clock recovery further requires synchronizing the recovered virtual periodic clock with the analyzed threshold crossings by adjusting the phase of the virtual clock.

The "error" or time difference between the expected value of a threshold crossing transition time (given by the virtual periodic clock) and the observed threshold crossing time can be used as a feedback to alter the expected value of a threshold crossing time (and therefore the recovered clock). In accordance with this procedure, the expected value of a threshold crossing transition time (recovered clock) is locked to the actual observed value of the threshold crossing transition time. This kind of feed-back in the context of clocks in an analog apparatus is called a "phase-locked-loop" (PLL). In accordance with the invention, the implementation is in software and the expected times are calculated by adding floating-point numbers rather than using resonating circuits. By removing the variability of any physical components, the timing of such a virtual clock can be precisely correlated to the data signal. Furthermore, the response of the PLL can be very precise and stable thereby making its effect on the measurement very predictable and precisely repeatable.

By thus locking the expected value of a threshold crossing transition time to the actual observed value of the threshold crossing transition time, this expected value of a threshold crossing transition time can be used to derive the ideal "sampling times" of the digitally encoded signal in the stored waveform. These sampling times can be used as the virtual clock signal. Using the thus-recovered virtual clock, the long data record can be sliced into smaller data records, each one including one or more bit intervals. These smaller records, or segments, can be overlaid to create an accurate eye diagram. The set of slices extracted from such a signal, allows for very accurate mask violation testing to be performed on a long, high-speed data signal.

By re-sampling the data record exactly between each virtual clock transition, the bit states for each bit interval can be deduced. This allows for the determination of ISI (Inter-Symbol Interference) from such data signals. In addition, since all of the bit periods are derived from the data stream and not from independent triggers, the effect of trigger jitter is eliminated.

Regarding the rendering of an eye diagram, there has been employed a standard method that has been used for many years to observe noise and jitter in communications signals. The procedure consists of triggering an oscilloscope on a data-stream with some trigger delay greater than one bit period so there is some "synchronicity" between the display and the observed data-stream. Since the data (for simplicity assumed to be non-return to zero (NRZ) data) has a relatively random state relative to the initial state at the time of trigger, a shape called an "eye-diagram" appears on the oscilloscope screen. This method is useful for formulating a visual conception of the variations in signal shape with regard to voltage and timing, these factors playing a role in the reliability of operation of the data channel being observed.

A better method for this procedure includes the steps of triggering the oscilloscope on the clock with which the signal would be received. One is therefore able to observe variations in voltage and time in a fashion most similar to such variations in an actual receiver circuit. A significant drawback with this second method is however, that in very many cases, the receive clock is not available. Other complications may also arise even when such a receive clock is available, such as the triggering instability of the measuring instrument contributing significantly to the jitter observed in the eye diagram.

Therefore an improved method and apparatus for generating a clock signal and locking the phase of an acquired signal thereto to allow for improved measurement fidelity thereof would be desirable. Also, an improved method and apparatus for rendering an eye diagram would be desirable. The present invention provides such an improved technique.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

DETAILED DESCRIPTION OF THE PREFERRED EMBODIMENTS

In accordance with the invention, a long, continuous acquisition record of a data signal is captured and stored, including every bit in the data signal during a predetermined duration corresponding to up to millions of bits or more. Such a long, continuous data signal is acquired and stored so that each and every bit in the signal can be processed and later retrieved, as will be described below.

Clock Recovery

Figure 1:
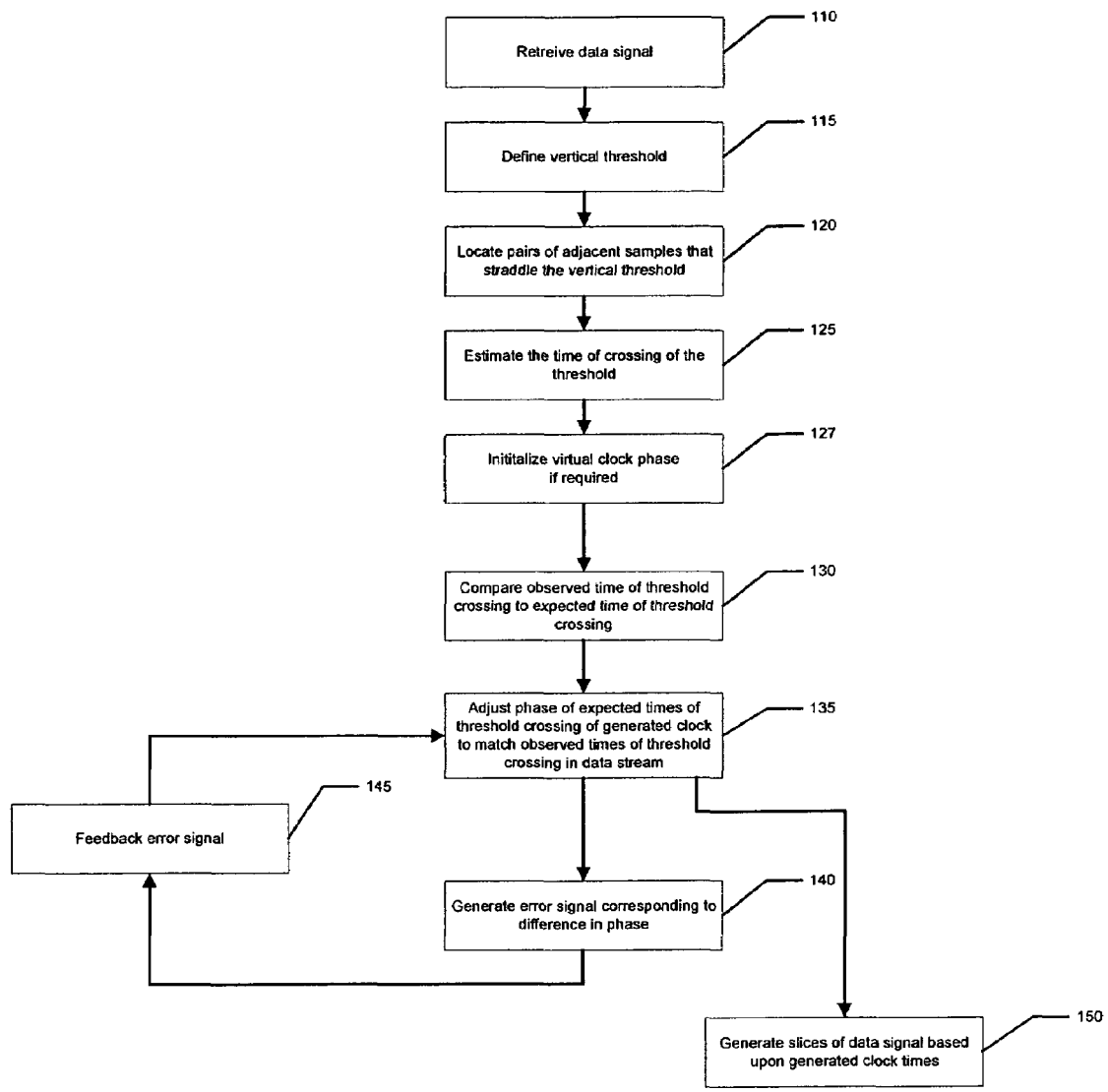
FIG. 1 is a flowchart diagram depicting the procedure for analyzing an acquired and stored waveform and generating a recovered clock associated with the stored waveform.

Referring first to FIG. 1, a flowchart diagram depicting the procedure for analyzing an acquired and stored waveform and generating a recovered virtual substantially periodic clock associated with the stored waveform is shown. In step 110 an acquired, stored data signal is retrieved from memory. Then, at step 115, in order to analyze the data signal for threshold crossings to subsequently define a series of "samples" acquired at nearly uniform sample-intervals, either an absolute or a relative (percentage of the recorded waveform's amplitude) threshold is defined. At step 120, each portion of the data signal is compared with the threshold to locate pairs of adjacent samples of the data signal that straddle or span the threshold. That is, one sample is greater-than-or-equal-to the threshold and the adjacent sample is less-than-or-equal-to the threshold. Hysteresis requirements must also be taken into account before an identified sample pair can be accepted as a true independent threshold crossing point, thus eliminating local noise that would contribute to jitter. Thereafter, using either linear or non-linear interpolation, an estimate of the time of crossing through the threshold that is more precise than the sample interval is made at step 125. This defines an observed time of threshold crossing. At step 127, the phase of the virtual clock is initialized. This is accomplished by setting the initial phase equal to the time of threshold crossing of the first observed transition. (i.e. the first observed crossing time serving as an estimate of the recovered clock's initial phase). The initial phase must be further refined by one of several methods: either 1) the first N transitions in the data are discarded or 2) after some number, N transitions have been detected, the initial phase of the virtual clock is revised to give a mean time-error for these N transitions of zero, then processing is restarted. Both methods address the issue of PLL start-up or PLL acquisition time. The second of these procedures is appropriate to the case where it is desired to make the recovered clock to have a highly accurate period ("perfectly" periodic) rather than tracking low frequency variations of the input data stream.

The observed times of threshold crossing are compared to an expected time of threshold crossing at step 130. The expected times of threshold crossing correspond to the regular intervals of an entirely conceptual or virtual "periodic clock" that is intended to correspond, after correction as noted below, to the sequence of expected times of threshold crossing.

The phase of the recovered clock is then adjusted to properly synchronize with the observed times of threshold crossing in the recorded data signal in step 135. The amount of phase adjustment in each bit interval is determined by mathematical algorithms precisely defining the dynamic response of the software PLL. The dynamic response of the PLL can be matched to the communications standard associated with the data signal under analysis under software control.

Because the recorded waveform under analysis is not necessarily of a clock but rather of a data stream presumably generated in accordance with a clock, a transition will not occur for each bit interval. That is, some transitions in the actual data signal may not be present because some consecutive bit locations may have the same value (consecutive logic "1", for example), and therefore not have a transition between them. It is possible to determine how many of these bit locations do not have transitions by assuming that the observed transitions have a correspondence with the closest expected transition of the generated virtual clock. As such, it is possible to associate every transition observed with a virtual clock transition, and to know exactly how many cycles of the generated virtual clock have passed since the previous observed transition.

As in an analog phase-locked-loop (PLL) a phase error (time interval error "TIE") between the expected value of a threshold crossing time determined in accordance with the recovered virtual periodic clock and the actual observed value of the threshold crossing time can be used as a feedback signal to alter the expected value of a threshold crossing time, and thus the phase of the recovered virtual clock, as is shown in step 140. In step 145 this generated error feedback signal is fed back and used at step 135 to adjust the phase of the expected time of threshold crossing. This procedure is repeated and continued until all the expected values of threshold crossing times, and therefore phase of the recovered virtual clock is locked to the actual observed values of the threshold crossing times. In accordance with the invention, the implementation is in software; the expected times being calculated by adding floating-point numbers rather than using resonating circuits, but the result being quite similar. The result is also more repeatable than the analog counterpart because the functionality does not depend on manufactured components that have initial inaccuracies and which change over time and varying environmental conditions, but rather is a mathematical calculation. Thus, any additional jitter generated in accordance with physical generation of a clock signal is avoided.

By locking the expected time values of a threshold crossing to the actual observed values of the threshold crossing time, this expected value of a threshold crossing time can be used to derive the ideal "sampling times" of the digitally encoded signal in the recorded waveform, as is shown in step 150. These times are between the expected times of threshold crossing (when that data is NOT changing, rather than when it is changing). Having determined these expected values of time of threshold crossing, and thus ideal sampling times, the recorded waveform can be decoded according to these ideal sampling times (recovered periodic clock) to determine bit states of the data during each "slice" of the data signal.

Each slice of data is therefore obtained from a recorded signal of many bit transitions and by using the clock recovery system in accordance with the invention. The waveform of the data signal can therefore be sliced up and represented as a series of smaller waveforms (each derived from the original) but which span some number of bits from the original data signal in a precisely prescribed period of time. As such, a "slicer" serves the purpose of supplying such waveforms each of which is a subset of the waveform of the input data signal, and that are synchronized with the recovered clock (extracted from the same waveform), and for which the state of the bits in each slice are (or can be) known. Specifically, as displayed on an oscilloscope, it supplies waveforms with an effective trigger time corresponding to, for example, the first division (of ten) and an end of one bit interval (unit-interval) at the 9th division on the oscilloscope display, although other timing sequences may be employed as desired. As such these waveforms are ideal for further processing as they are precisely synchronized and in phase with the recovered virtual clock.

Figure 7:
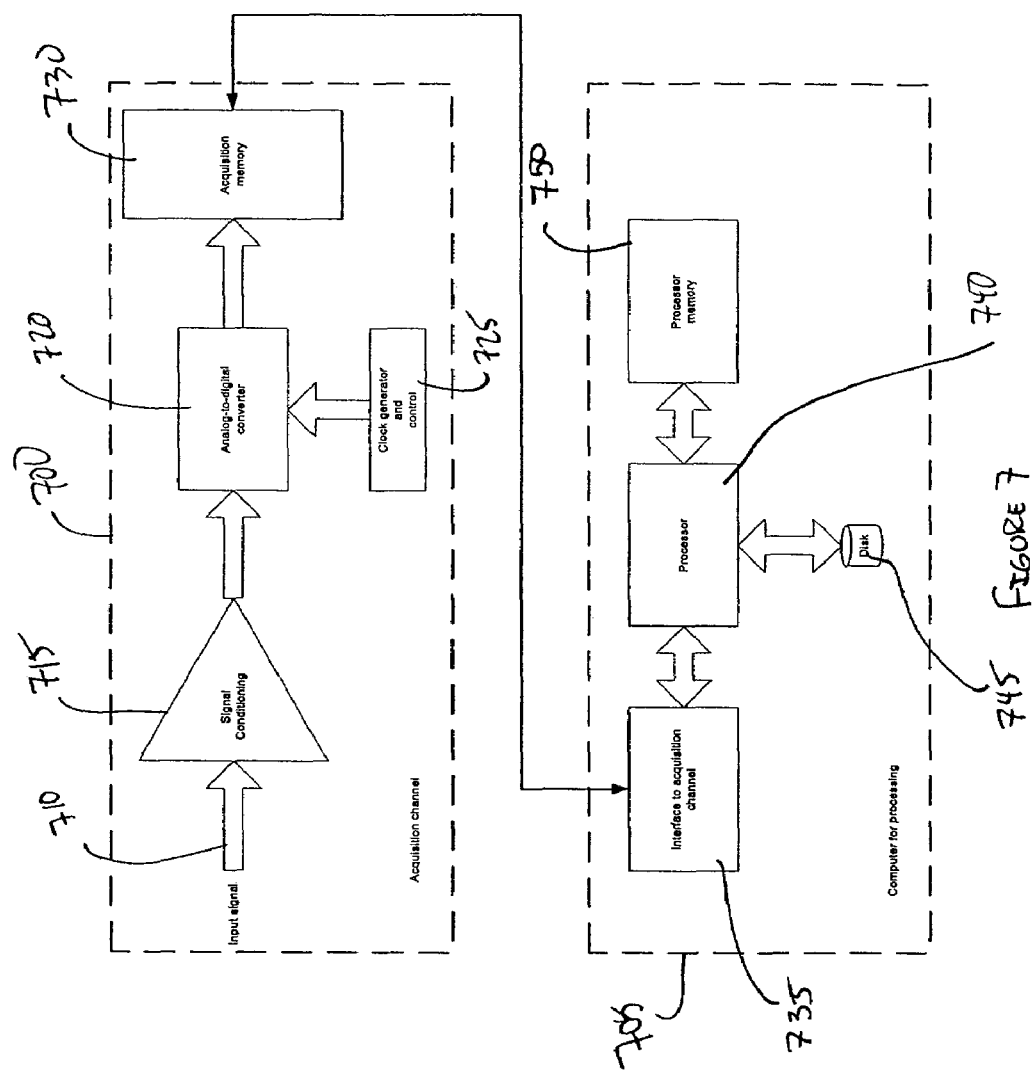
FIG. 7 is a block diagram depicting an apparatus for performing the method of the invention.

Referring next to FIG. 7, a block diagram representing an apparatus for performing the clock recovery and slicing in accordance with the invention is shown. The apparatus comprises a data acquisition channel 700 and a processing unit 705 for processing various acquired data. Data acquisition channel 700 receives an input analog data signal 710, and conditions or processes the signal to insure a clean signal at a signal conditioning unit 715. The conditioned signal is passed to an analog to digital converter 720 that digitizes the acquired, conditioned analog signal. This analog to digital conversion is performed in accordance with an externally generated clock and controller 725. Preferably, in accordance with the invention, the generated clock is very stable, and evidences very little jitter. Once the digitized signal has been formed, this digitized signal is stored in an acquisition memory 730.

When the acquired digital signal is to be processed an interface unit 735 of processing unit 705 retrieves the digitized data signal from acquisition memory 730, and provides the signal to a processor 740. Processor 740 includes a clock recovery unit therein for recovering a clock from the digitized data signal, as described above. Upon recovery of such a clock, the digital data signal is sliced into a plurality of data segments of a predefined length, and these data segments are stored in a disk storage, or other storage 745. A processor memory 750 is also provided for use by processor 740 during processing to hold various temporary values, registers, etc. Once the various data segments have been defined, processor 740 is able to perform the various functions noted above and below, such as drawing an eye diagram, performing mask violation testing and locating, instructing a display to properly display the determined data, and any other functions that might be performed on a plurality of data segments.

Mask Violation Locator

A mask violation locator is also provided in accordance with the invention. A mask violation locator operates by comparing an acquired signal that is preferably displayed as an eye diagram to a predetermined mask defined by a mask definition unit. Any portions of the acquired signal that are determined by a determiner to cross into an excluded region of the mask constitute a violation condition. In this manner, a data signal can be compared to a predefined set of criteria to ensure that the signal is of acceptable quality.

The mask violation locator in accordance with the invention operates by first acquiring a long record of digitized samples of a serial data signal under test (as noted above). This acquired record is stored, and is then subsequently retrieved and divided into intervals including a predetermined number of bits as determined through the clock recovery process and slice generating process performed on the digitized signal as described above.

Figure 2:
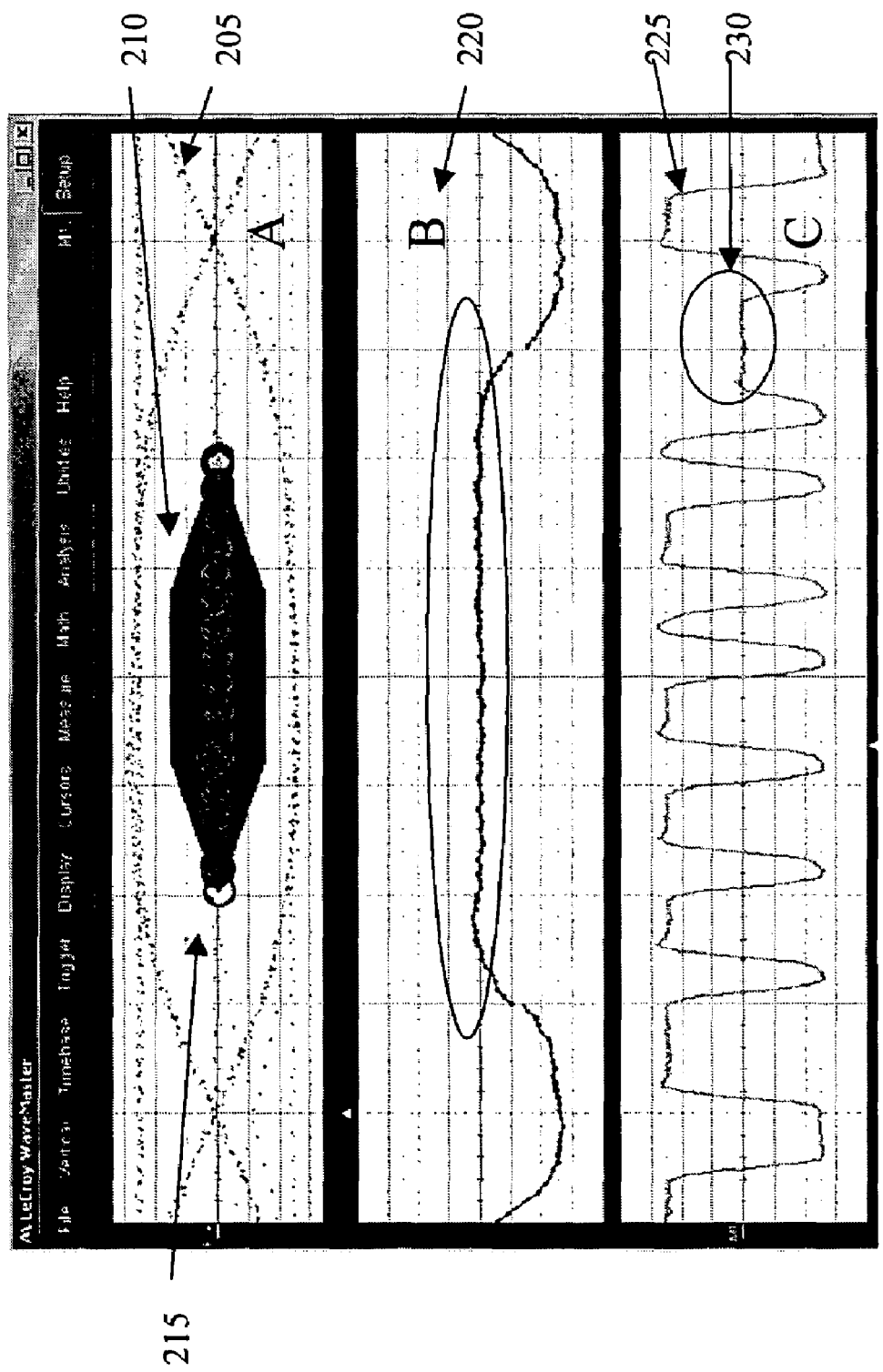
FIG. 2 is a screen shot representation of a mask violation locator display in accordance with the invention.

As is shown in FIG. 2, each segment of the original record divided in this way is indexed by its segment number and accumulated with all of the others segments in an x,y,z display 205 where the x and y values are the sample number and corresponding voltage level and the z axis accumulates the frequency of occurrence of each x,y value. A mask 210 defines areas in the x,y plane that no signal values should occupy. Any signal values that cross into the excluded regions defined by the mask (such as those marked with circles 215 at portion A) are identified by their location and segment number, as well as by their segment or bit number and can be displayed individually in the time domain. Thus, as is shown at portion B, an enlarged view 220 depicts a portion of a single bit of the data segment that violated the mask. This viewing procedure can be performed for all data segments that include a mask violation, thus allowing a user to choose to see a list of segment indices that violated a selected region of the mask, or all segments that violated the mask. This view at portion C shows the original bit data of the data stream that violated the mask, as well as the surrounding bits of the original signal

225. The violating bit is marked with an oval 230. The mask violation locator therefore not only indicates when a signal violates a mask, but also displays a segment of the digitized signal that violated the mask corresponding to the index specified by the user. Because the entire data stream is stored, this procedure can display any bit of the data stream, thus allowing for further consideration by a user. For example, if the original data stream consists of one million bit periods and the slicer slices the original data stream into single bit periods in accordance with the invention described above, there will be one million segments overlaid to generate the eye diagram. If a mask error occurs in the thousandth bit period (bit period number 1,000) the segment index of 1,000 will be shown. The user can then display that portion of the original data stream for further inspection to help determine the cause of the mask violation.

Figure 3:
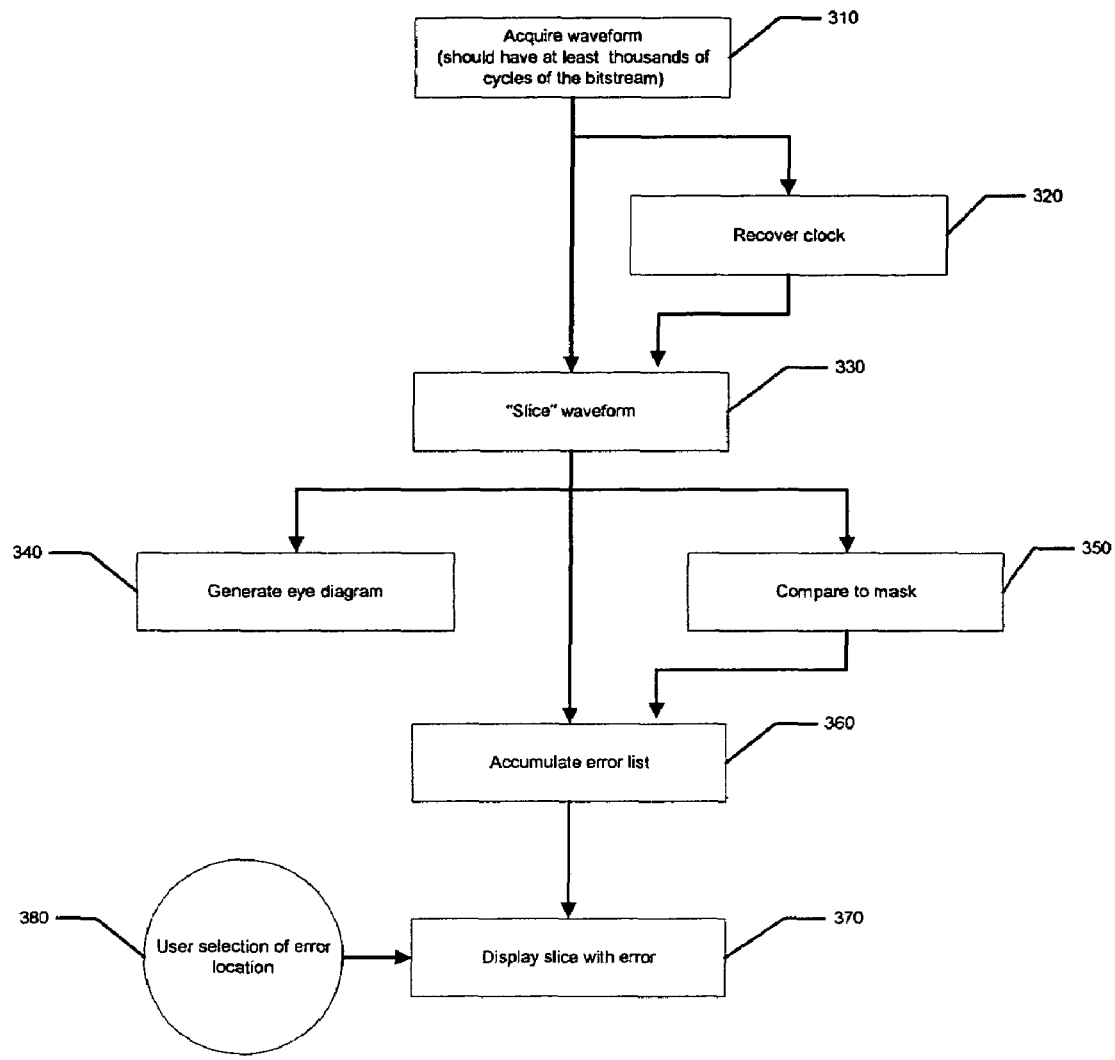
FIG. 3 is a flowchart diagram depicting the processing steps for implementing the mask violation locator.

Referring next to FIG. 3, a flowchart diagram depicting the processing steps for implementing the mask violation locator is shown. At step 310, a waveform, such as that described above, is acquired. Such a waveform is preferably representative of a high-speed data signal including thousands (or millions) of cycles in the bit stream. Then at step 320, a clock is recovered from the acquired waveform in accordance with the invention as described above. The acquired waveform and recovered clock signal are then fed to a slicer at step 330 that generates precise slices of the waveform, in a manner again as described above. These sliced waveforms are then fed to generate an eye diagram at step 340, to compare the data thereof to a mask at step 350, and to accumulate an error list at step 360.

Figure 5:
FIG. 5 is an example of an eye diagram produced from a single recorded signal in accordance with the invention.

At step 340, an eye diagram is generated by overlaying each sliced segment of the original data signal and accumulated with all of the others segments in an x,y,z display where the x and y values represent a time of acquisition and corresponding voltage level and the z axis accumulates the frequency of occurrence of each x,y value, as is shown in FIG. 5 at 510. The present invention generates a so called "sliced-eye-diagram", because it consists of a method and procedure according to the invention to assimilate one large record of a data or communication channel into an eye-diagram with relatively perfect timing relation to the extracted system clock, thus reducing jitter that is typically generated in accordance with various physical clock mechanisms and triggers. This method may also be used with a supplied system clock, although it is not required. This method allows for a very repeatable and very rapid evaluation of the nature of the "eye" of a communications or other data signal. While employing the theory of a hardware phase-locked-loop, as described above, this method does not require such a circuit for performing the overall measurement. Thus, the method leverages the information contained in a digitally recorded signal of long duration. First a signal is captured which contains many "symbols" or many "bit-intervals" of a serial data communication channel. The quality of the recording should be as precise as, or more precise than, the phenomena to be observed. In this case the vertical noise and time-base "jitter" must be considered, since they will contribute directly to the information manifested by the sliced-eye-diagram.

A long record is analyzed for threshold crossings, and if (as is usually the case) the signal under test is a data channel, instead of a clock, the crossings are associated with virtual clock edges, as described above.

In what would otherwise be a calculation of the Time Interval Error (TIE) one finds the dependent information of the exact extracted clock edge time, and from this information a small subset of the original waveform can be presented with the "correct" time association with the virtual (expected) clock, as was described in detail above and generated in accordance with the feedback process associated with the clock generation and slicing sequences.

Given these subset representations, the long-memory record containing many symbols duration or bit intervals, can be re-expressed as a multitude of smaller waveforms, each occurring at their exact time and thus eliminating trigger jitter, on a display grid synchronized with the equivalent communications receiver's expected clock timing. This procedure can supply a very rapid response (allowing for a single large acquisition rather than many small acquisitions), the quality of which is independent of the trigger stability of the recording instrument, but which is instead dependent only on the recording instrument's channel noise characteristics and time-base (sampling interval) stability which can be better than the trigger stability by more than an order of magnitude. In a preferred embodiment of the invention, it is estimated that at the current state-of-the-art, it should be possible to acquire and display a sliced-eye-diagram at an equivalent rate of 500 thousand bit waveform acquisitions per second for a communications signal of 2 Gigabits per second, recorded at 20 Gigasamples per second. This is a valuable capability in a single-shot digital oscilloscope or any piece of communications test equipment.

FIG. 5 is an example of an eye diagram 510 produced from a single recorded signal XAUI 3.125 Gigabits/second recorded with a WM 8500 at 20 GS/s, and processed in accordance with the apparatus and method of the invention.

Referring back to FIG. 3, additionally, a mask defining areas in the x,y plane that no signal values should occupy is compared to each of the bit in the generated slices of the data signal at step 350. Any signal values that cross into the excluded regions defined by the mask constitute a mask violation condition, and are passed to an error list accumulation process at step 360. The operation of this error list accumulation step will now be described with reference to FIG. 4.

Figure 4:
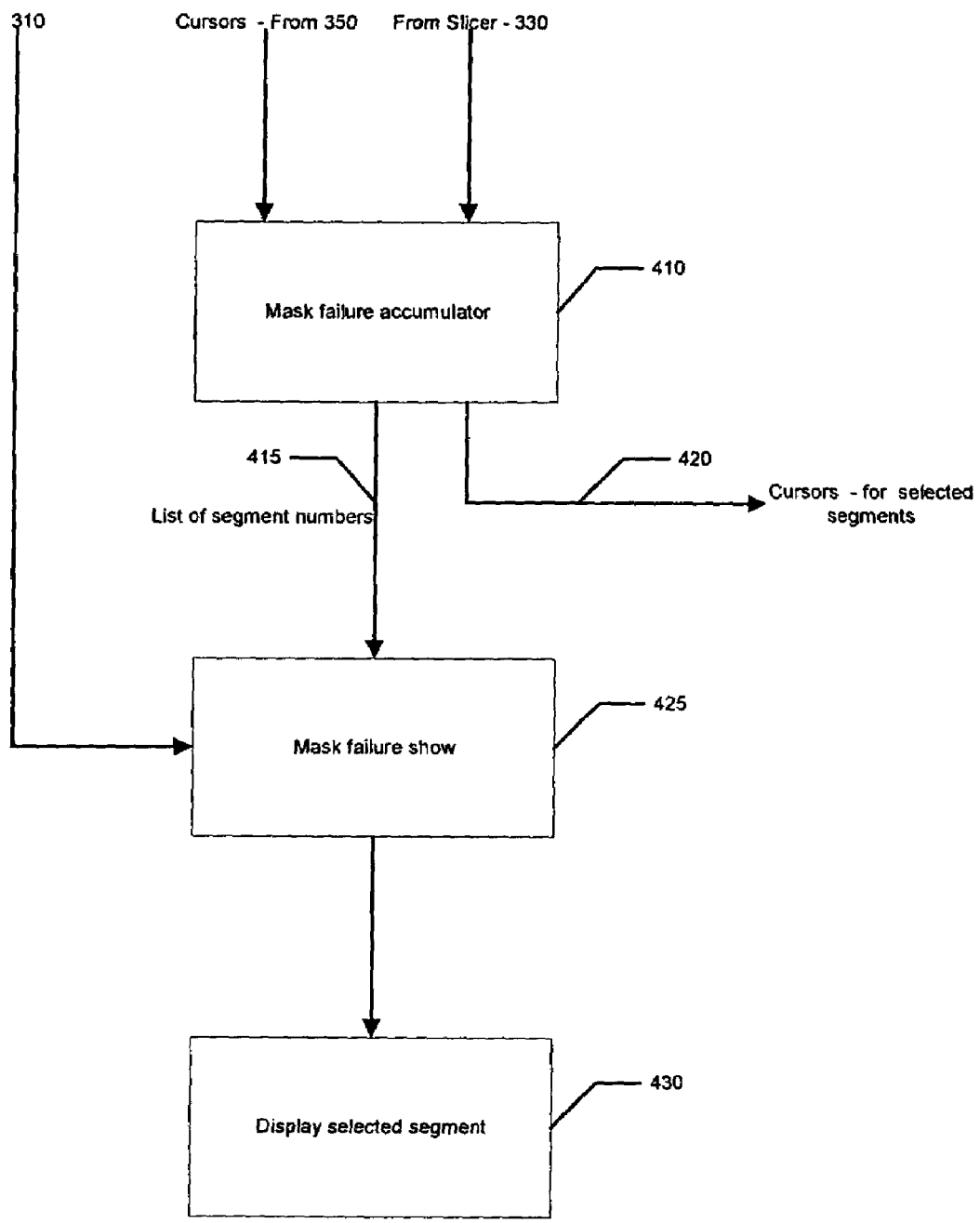
FIG. 4 is a block diagram representation of the Accumulate Error List unit of FIG. 3.

As shown in FIG. 4, a Mask Failure Accumulator 410 for use in accumulating an error list at step 360 of FIG. 3 has two inputs: a first input of sliced segments of the acquired waveform is received from a slicer that obtained these slices in step 330 of FIG. 3, and a second input, consisting of cursor values indicative of where a waveform produced mask violation. A Boolean value indicating whether a particular slice of the waveform contains a determined eye mask violation as determined in step 350 of FIG. 3, is received from the compare to mask step 350. Mask Failure Accumulator 410 similarly generates two outputs, a list 415 of all the segment numbers of slices of the waveform which contain a mask error violation, and a plurality of cursor values (for drawing failure circles) as selected by a user 420 to be used for rendering and displaying various of the waveform slices containing an error mask violation, such as a display shown in FIG. 2. Parameter output 415 including the list of segments including a violation is forwarded to a Mask Failure Show unit 425 while cursor values 420 are provided directly to a display unit at step 370 of FIG. 3, described below. Mask Failure Accumulator 410 also has a method for clearing any accumulated data, not shown.

Mask Failure Show unit 425 receives two inputs, list values 415 from Mask Failure Accumulator 410 listing segment numbers containing a mask error violation, and the original waveform data from 310 of FIG. 3. Mask Failure Show unit 425 produces only one output, a batch of waveforms including all the sliced waveform segments that failed near the selected cursor location for display. This output is provided to a display unit in step 370 of FIG. 3, described below.

Therefore, upon the receipt of various waveform slices and cursors that define an area of interest, the Mask Failure Accumulator accumulates a list of waveform slices, or segments that violate a mask. This list of segments is forwarded to the Mask Failure Show unit, which chooses the corresponding received waveform slices, and forwards them to be displayed in a manner as shown in FIG. 2, including the eye diagram bit causing an error, and actual bit stream data before and after the bit with the error. The internal construction of the Mask Failure Accumulator will now be described.

The Mask Failure Accumulator contains a 16×20 array of bins, which correspondingly map to a displayed frame. In a preferred embodiment, each bin therefore corresponds to ¼ of a major division square of an oscilloscope display. Each defined bin is associated with a vector containing the indices of segments with any detected mask failures positioned near the location of the particular bin. In a preferred embodiment, this vector is represented as a long integer since a short integer value may not be sufficient. The index of the current segment is obtained from the slicer at step 340 of FIG. 3. Whether or not a particular currently provided slice of the waveform had mask violation failures therein is determined by whether there are any results available on the Cursors input pin from the compare to mask step 350 of FIG. 3 corresponding to the currently supplied slice of the waveform. If there are, the location of failures are specified by the cursor coordinates and are mapped to the 16×20 grid and the index of the segment is added (if not already there, i.e. if not already recorded as having a prior mask violation) to the corresponding vector. The vectors will always be in numeric order. Because the segments are obtained in order, to see if the segment is already recorded it is only necessary to look at the last (prior) entry in the vector.

The output results provided by the Mask Failure Accumulator 410 corresponding to the parameters 415 are built based on the contents of the array of lists and a bounding box specified by various user-selected control variables. The Parameter output 415 contains representations of all of the failures corresponding to any bins that are at least partially included in the user defined bounding box. The cursor output provided by the Mask Failure Accumulator 410 is based on the control settings (e.g. how many bit intervals before and after the bit containing the error are to be shown) and the failure information provided by the compare to mask unit 350.

The Mask Failure Show unit 425 receives the original waveform from 310, and the list of segment numbers 415. The list 415 includes horizontal coordinate information identifying the region of the original waveform associated with each mask failure to be shown.

Referring back to FIG. 3, upon designation of various sliced waveform segments to be displayed, including one or more mask violation errors in accordance with the procedure employing mask failure accumulator 410 and mask failure show 425 as described above, these segments are displayed at step 370 of FIG. 3 in a manner similar to the display shown in FIG. 2. As is shown in FIG. 3, a user may enter various error location selection criteria for selecting one or more errors to be displayed at step 380. In this manner, the appropriate display is provided.

There are many significant benefits associated with the present invention.

1. The dependence on the trigger stability of the oscilloscope or waveform digitizing equipment is removed from the measurement, since ultimately the trigger timing information is entirely discarded. In other words, the measurement no longer requires a highly stable trigger. In contrast however, this method requires the digitizing time-base of the original analog-to-digital converter employed during signal acquisition to have very little jitter, or in other terms, very little phase-noise. This is a trade-off leveraged by the invention disclosed in this application.

2. Effects of the vertical noise on the communication channel under measurement are vastly reduced in their contribution to horizontal timing jitter. The trigger stability mentioned at item 1 depends also on the vertical noise on the signal or the vertical noise on the system clock when such a signal is available. This method circumvents the effect of vertical noise on the trigger circuitry and consequential misplacement in time of the signal. In other words, the waveform slices are correctly placed in time regardless of the vertical noise on the signal, and independent of any hardware trigger.

3. The invention allows for a simple implementation of a tracking PLL that supplies two major benefits to the procedure. First, the PLL is "virtual", being calculated completely using floating point arithmetic, and so its response is entirely controlled and repeatable, and is not subject to any variations in any physical components. Second because the implementation is in software, the expense of an external clock extraction and PLL is avoided.

4. This procedure and method allows for a very rapid evaluation of the communications channel under observation. Further processing on the "persistence map" and/or on the set of waveform slices obtained by such a method can provide extensive parametric information concerning the jitter, noise and predicted bit-error rates.

Method for Determining ISI (Inter-Symbol Interference) from Long-Memory Recording of Data Communications Signals It is well known that interference between symbols in data or communications signals is a contributor to both vertical and horizontal signal variations. The basic effect is that the shape and timing of the data-symbol is affected by the precise sequence of prior symbols. That is, the symbols immediately preceding an observed bit-interval affect the eye-diagram observed. Thus, even employing the procedure noted above, various other distorting factors must be accounted for.

This portion of the invention described herein provides a method for isolating the individual contributions to ISI based upon an analysis of data acquired in a single (or multiple) acquisitions or recordings of the communications channel under observation. By determining this systematic contribution to horizontal timing jitter, one obtains directly a distribution of jitter which is fundamentally "bounded" and deterministic for a representative data stream. (i.e. one of the components of deterministic jitter is extracted directly from the recording of the communications channel).

The present invention operates as a "sliced-pattern-averager" and therefore employs a variant of the slice method as noted above. In accordance with the invention, one large record of a data or communication channel is assimilated into a series of signal averaged signals, each specific to a certain prior symbol-state pattern or sequence.

In accordance with this invention, a specific ISI component of jitter and of vertical variations in the communications channel may be identified. Thus, a diagram similar to an eye-diagram, but which is (relatively) free of random noise is provided, since the signals are "signal averaged" to eliminate noise. Finally, this method provides a means for obtaining the horizontal distribution of ISI perturbations to the jitter distribution, which can be used as a tool for deconvolution of the total jitter distribution and further for the purpose of identifying the magnitude and shape of non-symbol-dependent jitter and vertical noise.

After obtaining the various slices of the waveform as described above, rather than combining all of these signals into a single persistence display, the information is examined for N intervals prior to an observed bit interval, and for the bit interval immediately following the bit-interval under observation. The signal is analyzed for the NRZ state at the center (between the virtual recovered clocks) to obtain the each bit state and thus the exact bit sequence of each small record (subset) consisting of M=N+1+1 bits. The slices are thus classified into 2 to the power M categories. Then depending on the precise pattern of bits for each slice, one of 2 to the power of M averages is updated. It is important to note that typically each of these averages has greater horizontal resolution than the original waveform, and thus the average is not a simple average. Thus, for each possible pattern of the M bits, an average output for each small record is provided by averaging all of the M bit sequences.

Figure 6:
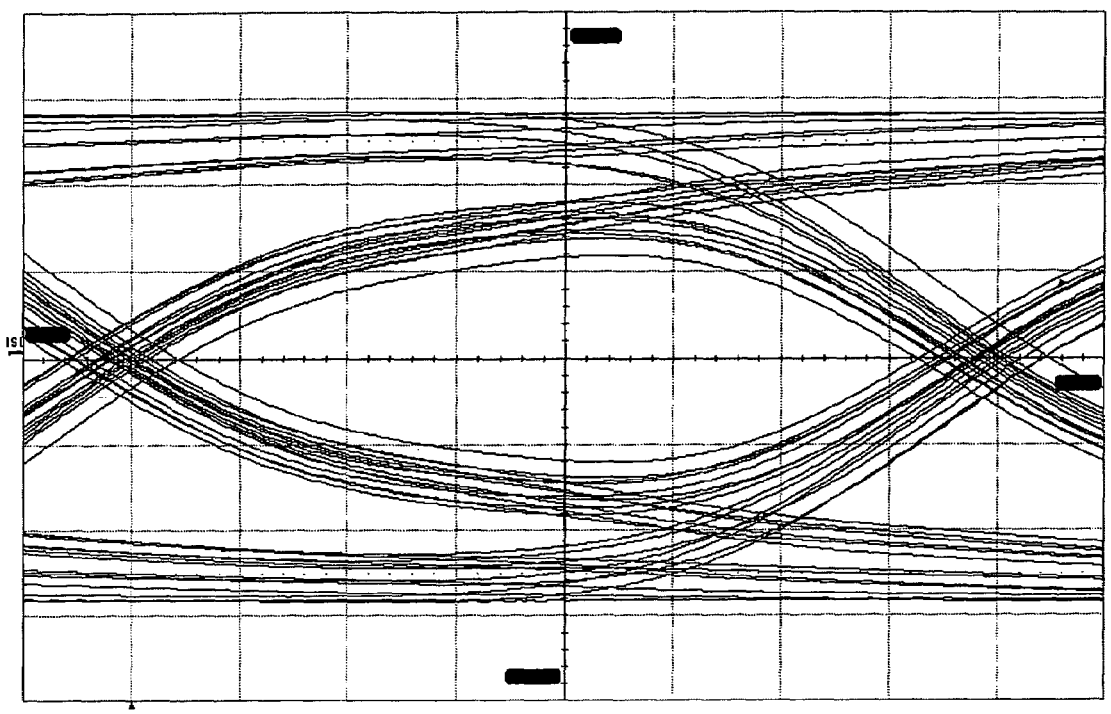
FIG. 6 is an example of an ISI plot produced from a single recorded signal in accordance with the invention.

Upon completion of analyzing the entire waveform, the 2 to the M resultant waveforms, which are each an average of the actual signal data, are superimposed on a single bit interval display. This overlaid display is quite similar in scale and shape to the eye-diagram which could have been formed by using all of the actual data signal information before averaging. However the vertical and horizontal randomness, in as much as it is incoherent with the bit patterns (the 2 to the power M sequences) is averaged "out" or removed from the diagram. Thus, as is shown in FIG. 6, one can "see" qualitatively that the data has been averaged into 32 separate groups and is displayed separated into 32 thin lines, the horizontal cross-section of this kind of this data representation yields a precise horizontal distribution, which is the distribution of deterministic ISI jitter. Likewise any vertical cross-section of the display will produce a fixed deterministic component for vertical variations.

This procedure can supply a very rapid response using fewer large acquisitions rather than many small acquisitions, the quality of which is independent of the trigger stability of the recording instrument, but which is instead dependent on the recording instrument's time-base (sampling interval) stability.

There are many significant benefits associated with this invention. This method allows for obtaining ISI contributions to both vertical and horizontal signal variations (jitter and noise). While other methods, such as in a digital sampling-scope (in contrast to a single-shot or real-time digital oscilloscope) are used to measure noise free symbol responses by stimulating the data stream with a known pattern, the method in accordance with the invention does not require a specific stimulus or even a priori knowledge of the patterns present in the data stream. Rather, it sorts the information from any (either PRBS or truly random . . . or even "live") data stream. The method determines ISI-based deterministic jitter and noise rapidly and free from the statistical assumptions common to the industry for the purposes of obtaining estimates of deterministic jitter.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An apparatus for processing a data signal, comprising:
    an acquisition unit of a test instrument for acquiring a data signal for a predetermined time;
    a memory of said test instrument for storing said data signal;
    a clock recovery unit for recovering a clock signal from said stored data signal; and
    a processor for slicing said stored data signal into a plurality of data segments of a predetermined length in accordance with said recovered clock signal.

2. The apparatus for processing a data signal of claim 1, wherein said clock recovery unit defines a threshold level relative to said stored data signal, compares each portion of the stored data signal to said threshold level, determines pairs of adjacent samples that straddle said threshold, and estimates a time of crossing said threshold between said adjacent samples to obtain a series of observed times of threshold crossing.

3. The apparatus for processing a data signal of claim 2, wherein said threshold is defined as an absolute value.

4. The apparatus for processing a data signal of claim 2, wherein said threshold is defined as a percentage of said recorded data signal's amplitude.

5. The apparatus for processing a data signal of claim 2, wherein said clock recovery unit further considers a hysteresis requirement to confirm that a determined pair of adjacent samples that straddle said threshold should be included as part of said series of observed times of threshold crossing.

6. The apparatus for processing a data signal of claim 2, wherein each said time of crossing of said threshold is estimated based upon a linear interpolation.

7. The apparatus for processing a data signal of claim 2, wherein each said time of crossing of said threshold is estimated based upon a non-linear interpolation.

8. The apparatus for processing a data signal of claim 2, wherein said series of observed times of threshold crossing is used to obtain a recovered virtual periodic clock.

9. The apparatus for processing of claim 8, wherein said clock recovery unit compares said series of observed times of threshold crossing to an ideal perfectly periodic sequence of expected times of threshold crossing comprising said recovered virtual periodic clock, determines an error between said observed times and said expected times, and adjusts the phase of said recovered virtual periodic clock in accordance with said determined error.

10. The apparatus for processing of claim 8, wherein said clock recovery unit compares each element of said series of observed times of threshold crossing to each element of an ideal substantially periodic sequence of expected times of threshold crossing, determines the error between each observed time and the corresponding expected time, and based upon each error and preceding errors, adjusts the instantaneous phase of the substantially periodic sequence of times of threshold crossing according to mathematical algorithms thus obtaining a specified dynamic response for the recovered substantially periodic clock.

11. The apparatus for processing said data signal of claim 8, wherein said processor determines the absence of one or more transitions of said data signal, locates a position of a next transition of said data signal, and associates said located next transition of said data signal with a closest expected time of threshold crossing of said recovered virtual periodic clock.

12. The apparatus for processing said data signal of claim 8, wherein said processor determines a number of expected times of threshold crossing that have passed between two transitions of said data signal between which an absence of one or more transitions has been determined.

13. The apparatus for processing said data signal of claim 8, wherein said processor determines said expected transition times in accordance with calculations employing floating point numbers.

14. The apparatus for processing a data signal of claim 1, wherein the clock recovery unit estimates a frequency of said recovered clock, and discards a predetermined number of predicted times of threshold crossings of said data segments until said recovered clock settles to a substantially periodic frequency.

15. The apparatus for processing a data signal of claim 1, wherein the clock recovery unit detects a predetermined number of transitions of threshold crossings of said data segments, revises an initial phase of said recovered clock signal to give a mean time-error of zero for said predetermined number of transitions, and restarts processing.

16. The apparatus for processing a data signal of claim 15, wherein said recovered clock signal is made substantially perfectly periodic.

17. An apparatus for displaying an eye diagram, comprising:
an acquisition unit of a test instrument for acquiring a data signal for a predetermined time;
a memory of said test instrument for storing said data signal;
a clock recovery unit for recovering a clock signal from said stored data signal;
a processor for slicing said stored data signal into a plurality of data segments of a predetermined length in accordance with said recovered clock signal; and
a display for overlaying said plurality of data segments in a time synchronized manner.

18. The apparatus for displaying an eye diagram of claim 17, wherein said display displays a second acquired data signal along with said first data signal.

19. The apparatus for displaying an eye diagram of claim 18, wherein said display displays said first and second data signal acquisitions after inter symbol interference processing.

20. The apparatus for displaying an eye diagram of claim 18, wherein said display displays said first and second data signal acquisitions after the data segments associated therewith are mathematically processed.

21. The apparatus for displaying an eye diagram of claim 17, wherein said clock recovery unit defines a vertical threshold relative to said stored data signal, compares each portion of the stored data signal to said vertical threshold, determines pairs of adjacent samples that straddle said vertical threshold, and estimates a time of crossing said vertical threshold between said adjacent samples to obtain a series of observed times of threshold crossing.

22. An apparatus for processing a data signal, comprising:
an acquisition unit of a test instrument for acquiring a data signal for a predetermined time;
a memory of said test instrument for storing said data signal;
a clock recovery unit for recovering a clock signal from said stored data signal by estimating a time of crossing of a threshold between adjacent samples of said data signal that straddle said threshold and considering a hysteresis requirement for determining if a pair of adjacent samples that straddle said threshold are part of a series of observed times of threshold crossing; and
a processor for slicing said stored data signal into a plurality of data segments of a predetermined length in accordance with said recovered clock signal.

23. The apparatus of claim 22, wherein said clock recovery unit determines an error between said observed times and expected times of threshold crossing by an ideal periodic sequence derived from said recovered clock signal, and adjusts the phase of said recovered clock signal in accordance with said determined error.

24. The apparatus of claim 22, wherein said clock recovery unit determines an error between each element of a series of observed times of threshold crossing and an element of a substantially ideal periodic sequence of threshold crossings derived from said recovered clock signal, and based upon each error and preceding errors, adjusts the instantaneous phase of the periodic sequence of threshold crossings according to mathematical algorithms to obtain a specified dynamic response for the recovered substantially periodic clock.

* * * * *